(12) United States Patent
Kim et al.

(10) Patent No.: US 7,060,544 B2
(45) Date of Patent: Jun. 13, 2006

(54) FABRICATING METHOD OF THIN FILM TRANSISTOR

(75) Inventors: Hae-Yeol Kim, Gyeonggi-do (KR); Jong-Uk Bae, Seoul (KR); Binn Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 211 days.

(21) Appl. No.: 10/317,217

(22) Filed: Dec. 12, 2002
(Under 37 CFR 1.47)

(65) Prior Publication Data

US 2004/0191965 A1    Sep. 30, 2004

(30) Foreign Application Priority Data

Dec. 26, 2001  (KR) .................. 10-2001-0084921

(51) Int. Cl.
*H01L 21/283* (2006.01)
*H01L 21/38* (2006.01)

(52) U.S. Cl. .................. 438/162; 438/166; 438/412
(58) Field of Classification Search ............... 438/148, 438/151, 162, 166, 412, 479
See application file for complete search history.

(56) References Cited

U.S. PATENT DOCUMENTS

| 5,646,424 | A  | * | 7/1997  | Zhang et al. ............... 257/66 |
| 5,962,897 | A  | * | 10/1999 | Takemura et al. .......... 257/347 |
| 6,066,547 | A  | * | 5/2000  | Maekawa ................... 438/486 |
| 6,225,197 | B1 | * | 5/2001  | Maekawa ................... 438/487 |
| 6,342,409 | B1 | * | 1/2002  | Seo ............................. 438/161 |
| 2002/0036724 | A1 | * | 3/2002 | Ha .............................. 349/38 |

FOREIGN PATENT DOCUMENTS

| JP | 11-111985   | 4/1999  |
| KR | 2000-0074449 | 12/2000 |
| KR | 2001-0097962 | 11/2001 |

* cited by examiner

*Primary Examiner*—Zandra V. Smith
*Assistant Examiner*—Pamela E Perkins
(74) *Attorney, Agent, or Firm*—McKenna Long & Aldridge LLP (57) ABSTRACT

A fabricating method of a thin film transistor includes forming an active layer of polycrystalline silicon, forming a first insulating layer on the active layer, forming a gate electrode on the first insulating layer over the active layer, doping side portions of the active layer with impurities, applying a small amount of metal to the side portions of the active layer and activating the side portions of the active layer such that the small amount of metal is adsorbed into the active layer.

23 Claims, 7 Drawing Sheets

FABRICATING METHOD OF THIN FILM TRANSISTOR

The present invention claims the benefit of the Korean Patent Application No. 2001-84921 filed in Korea on Dec. 26, 2001, which is hereby incorporated by reference in its entirety.

BACKGROUND OF THE INVENTION

1. Field of the Invention

The present invention relates to a liquid crystal display device, and more particularly, to a fabricating method of a polycrystalline thin film transistor that is a switching device in a liquid crystal display device.

2. Discussion of the Related Art

In a conventional process for forming a polycrystalline silicon layer, an intrinsic amorphous silicon layer is formed on an insulating substrate by using a plasma chemical vapor deposition (PCVD) method or a low pressure chemical vapor deposition (LPCVD) method. When the amorphous silicon layer has a thickness of about 500 Å (angstroms), it is crystallized into a polycrystalline silicon layer by a crystallization method. The crystallization method is generally either a laser annealing method, a solid phase crystallization (SPC) method or a metal induced crystallization (MIC) method.

In the laser annealing method, an excimer laser beam is applied to an amorphous silicon layer on an insulating substrate to form a polycrystalline silicon layer. In the SPC method, a heat-treatment is applied to an amorphous silicon layer at a high temperature for a time period sufficient to form a polycrystalline silicon layer. In the MIC method, a metal layer is deposited on the amorphous silicon layer. The deposited metal layer is used as a crystallization seed in a subsequent heat-treatment to form polycrystalline silicon. In the MIC method, a large-sized glass substrate may be used as the insulating substrate since the heat-treatment in the MIC method is below 600° C.

The laser annealing method has recently become a more prevalent method in forming a polycrystalline silicon layer. The laser annealing method includes forming an amorphous silicon layer on an insulating substrate and then melting the amorphous silicon layer with a laser. Subsequently, the melted amorphous silicon layer is cooled to form a polycrystalline silicon layer.

The SPC method includes forming a buffer layer on a quartz substrate that can withstand temperatures higher than 600° C. (degrees Celsius). The buffer layer prevents contamination from the the quartz substrate. Next, an amorphous silicon layer is deposited on the buffer layer and is heated in a furnace at a high temperature for a long time period to become a polycrystalline silicon layer. However, the heat-treatment of the amorphous silicon layer performed at a high temperature for a long time period can not obtain a desirable polycrystalline silicon phase, since a direction of grain growth is irregular. Thus, a gate insulating layer contacting the polycrystalline silicon layer is also irregularly formed when the irregularly formed polycrystalline silicon layer is used in a thin film transistor (TFT). Accordingly, a breakdown voltage of the gate insulating layer decreases. Further, since the grain size of the polycrystalline silicon layer is not uniform, the carrier mobility of the TFT is lowered. Furthermore, a high-priced quartz substrate should be used to withstand the high temperatures.

The MIC method forms a polycrystalline layer by using a large-sized glass substrate that has a low cost. However, film quality of the polycrystalline silicon layer is not reliable because a possibility that metal residue exists in the polycrystalline silicon layer is high. Accordingly, a field enhanced metal induced crystallization (FE-MIC) method that improves the MIC method is suggested. In the FE-MIC method, after a metal layer is formed on an amorphous silicon layer, a direct current (DC) high voltage is applied to the metal layer to generate heat. Since the metal layer functions as a catalyst, the metal is referred to as a catalyst metal in a MIC method.

FIGS. 1A to 1F are schematic cross-sectional views showing a fabricating process for a related art polycrystalline silicon thin film transistor using amorphous silicon. In this example, a field enhanced metal induced crystallization (FE-MIC) is used as a crystallization process in FIGS. 1A to 1F.

Figure 1A:
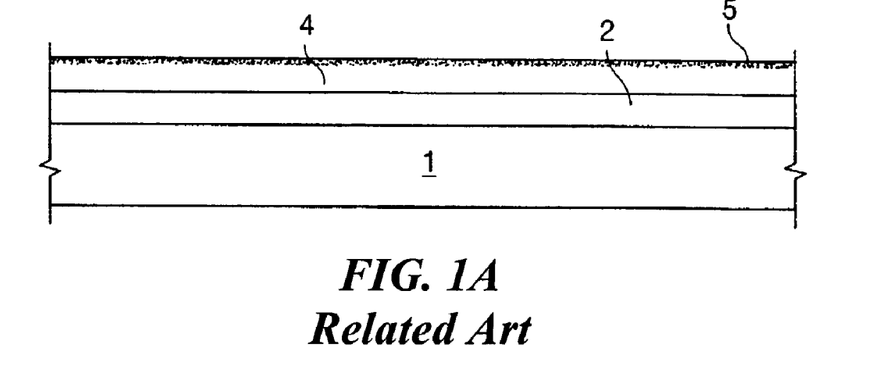
FIGS. 1A to 1F are schematic cross-sectional views showing a fabricating process for a related art polycrystalline silicon thin film transistor using amorphous silicon.

A buffer layer 2 and an amorphous silicon layer 4 are sequentially formed on a substrate 1, as shown in FIG. 1A. The buffer layer 2 prevents alkali materials in the substrate from causing contamination in subsequent processes. After the amorphous silicon layer 4 is formed, a catalyst metal layer 5 is formed on the amorphous silicon layer 4. In other types of crystallization methods, the catalyst metal layer 5 is not necessary.

Figure 1B:
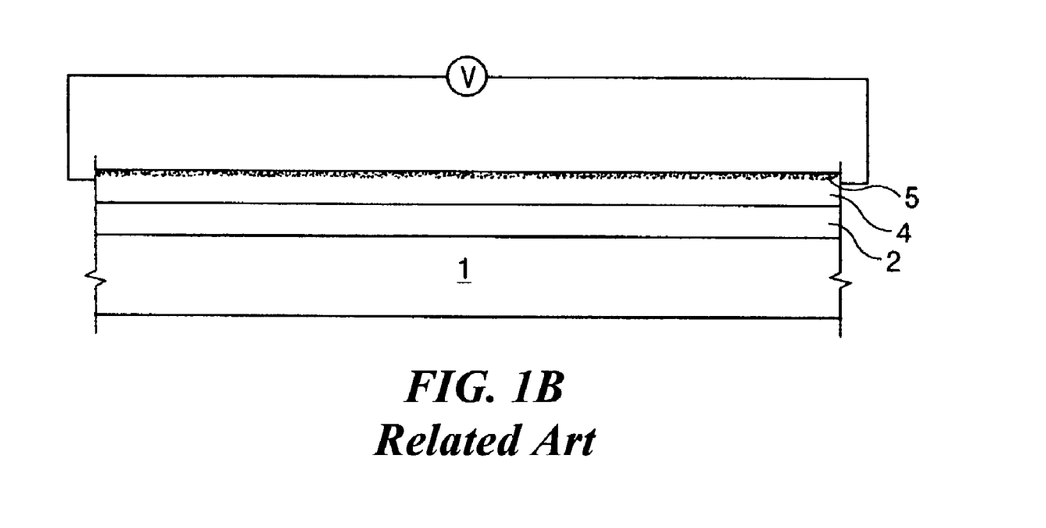

A voltage and a heat are applied to the amorphous silicon layer 4, as shown in FIG. 1B. Thus, the amorphous silicon layer 4 is crystallized to form a polycrystalline silicon layer.

Figure 1C:
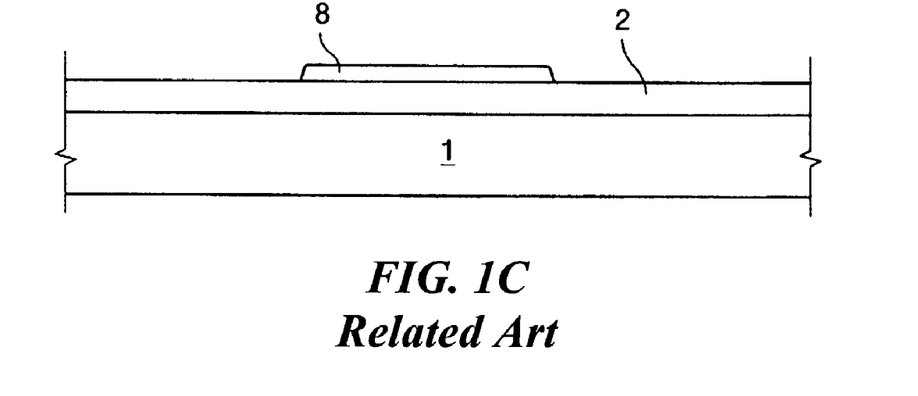

As shown in FIG. 1C, silicon island 8 of polycrystalline silicon is formed through patterning of the polycrystalline silicon layer.

Figure 1D:
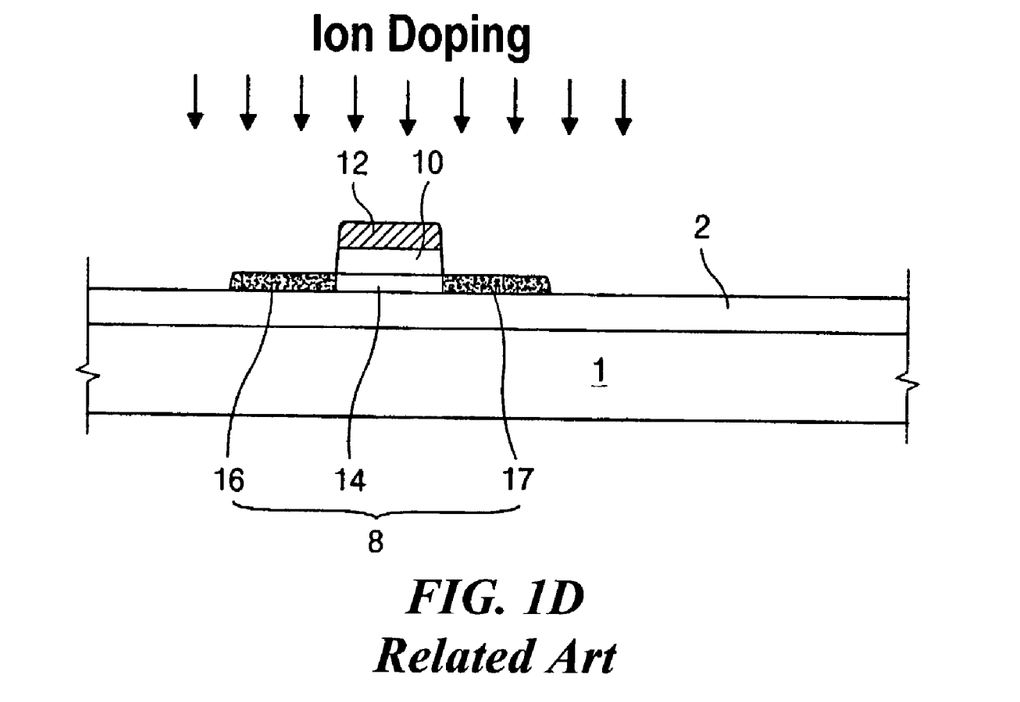

As shown in FIG. 1D, a gate insulating layer 10 and a gate electrode 12 are then sequentially formed on the silicon island 8. The silicon island 8 is classified into two regions: a first active region 14 of intrinsic silicon and second active regions 16 and 17, as shown in FIG. 1D. The second active regions 16 and 17 are disposed at respective sides of the first active region 14. The gate insulating layer 10 and the gate electrode 12 are formed on the first active region 14 of the silicon island 8. The gate insulating layer 10 and the gate electrode 12 are patterned with the same etching mask to reduce the number of masks. After the gate insulating layer 10 and the gate electrode 12 are formed, the second active regions 16 and 17 is doped with dopant impurities.

The gate electrode 12 functions as an ion stopper preventing ion penetration into the first active region 14. Electric conductivity of the silicon island 8 depends on the kind of dopant impurity ions used in the ion doping process. For example, when dopant impurities or ions from Group III, such as Boron (B) in $B_2H_6$, are doped, the corresponding portion of the silicon island 8 functions as a p-type semiconductor. When dopant impurities or ions from Group V, such as Phosphorous (P) in $PH_3$, are doped, the corresponding portion of the silicon island 8 functions as an n-type semiconductor. The kind of dopant impurities or ions are selected according to the intended use of a semiconductor device. After the ion doping process, the dopant impurities in the semiconductor island 8 are activated with an annealing process.

Figure 1E:
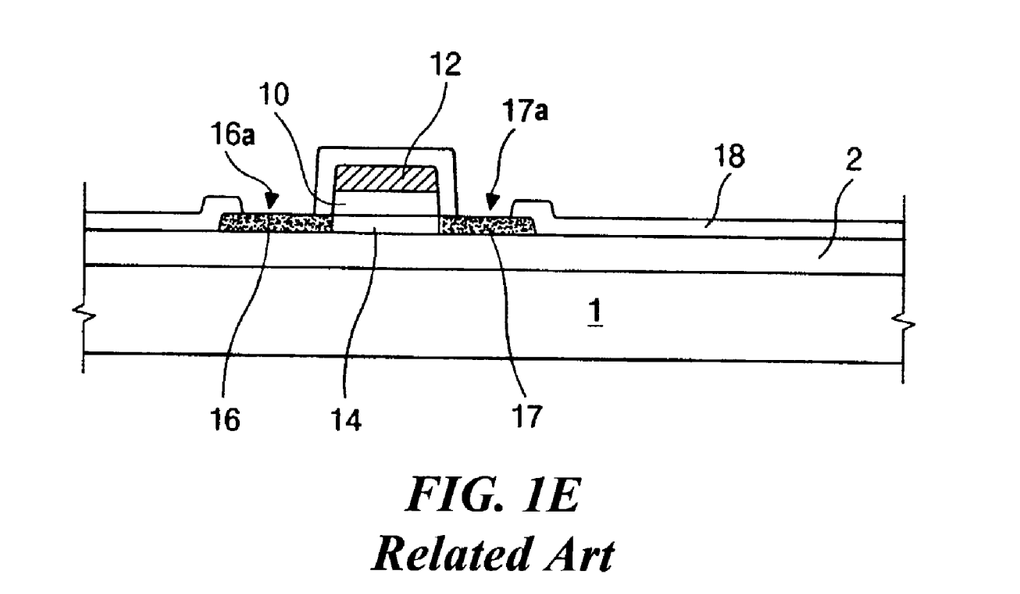

In FIG. 1E, an interlayer insulating layer 18 is formed on an entire surface of the substrate 1. The interlayer insulating layer 18 has first and second contact holes 16a and 17a exposing the second active regions 16 and 17, respectively.

Figure 1F:
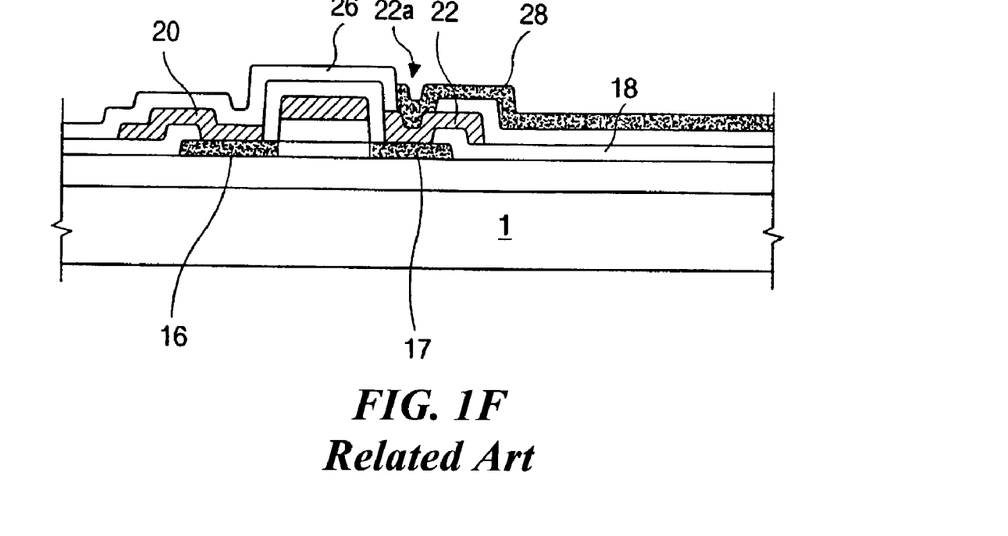

Source and drain electrodes 20 and 22 are formed on the interlayer insulating layer 18, as shown in FIG. 1F. The source and drain electrodes 20 and 22 are connected, respectively, to the second active regions 16 and 17 through the first and second contact holes 16a and 17a, respectively.

Next, a passivation layer 26 is formed on the entire surface of the substrate 1. The passivation layer 26 has a third contact hole 22a exposing the drain electrode 22. Next, a pixel electrode 28 is formed on the passivation layer 26. The pixel electrode 28 is connected to the drain electrode 22 through the third contact hole 22a. Thus, a polycrystalline silicon thin film transistor (p-Si TFT) is completed.

During the fabricating method of the related art p-Si TFT, the surface of the polycrystalline silicon film is damaged during the ion doping process. Accordingly, the polycrystalline silicon film is structurally and electrically degraded due to partial amorphization and dopant impurity-induced crystallinity defects. To solve these problems, an activation process that anneals the polycrystalline silicon film in a furnace is performed at a temperature between about 500° C. and about 600° C. prior to the source and drain electrodes being connected. However, the structural and electrical degradation of the polycrystalline silicon film are not sufficiently repaired even after the activation process.

SUMMARY OF THE INVENTION

Accordingly, the present invention is directed to a fabricating method of a thin film transistor that substantially obviates one or more of the problems due to limitations and disadvantages of the related art.

An object of the present invention is to provide an activation method in which the crystalline structure of a doped polycrystalline silicon film is repaired.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, A fabricating method of a thin film transistor includes forming an active layer of polycrystalline silicon, forming a first insulating layer on the active layer, forming a gate electrode on the first insulating layer over the active layer, doping side portions of the active layer with impurities, applying a small amount of metal to the side portions of the active layer and activating the side portions of the active layer such that the small amount of metal is adsorbed into the active layer.

In another aspect, a fabricating method of a thin film transistor includes forming a first insulating layer on a substrate, depositing an amorphous silicon layer on the first insulating layer, crystallizing the amorphous silicon layer to form a polycrystalline silicon layer, patterning the polycrystalline silicon layer to form an active layer having an island shape, forming a second insulating layer on a middle portion of the active layer, forming a gate electrode on the second insulating layer, doping side portions of the active layer with dopant impurities, applying a small amount of metal to the side portions of the active layer, activating the side portions of the active layer, forming a third insulating layer on the gate electrode and on the side portions after activating the side portions, wherein the second insulating layer has first and second contact holes respectively exposing the side portions and forming source and drain electrodes connected respectively to the side portions through the first and second contact holes.

In another aspect, a fabricating method of a thin film transistor includes forming an active layer of polycrystalline silicon, forming a first insulating layer on the active layer, forming a gate electrode on the first insulating layer over the active layer, doping side portions of the active layer with impurities, applying a small amount of metal to the side portions of the active layer, activating the side portions of the active layer such that the small amount of metal is adsorbed into the active layer, forming a second insulating layer on the gate electrode and on the side portions after activating the side portions, wherein the second insulating layer has first and second contact holes respectively exposing the side portions and forming source and drain electrodes connected respectively to the side portions through the first and second contact holes.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2A:
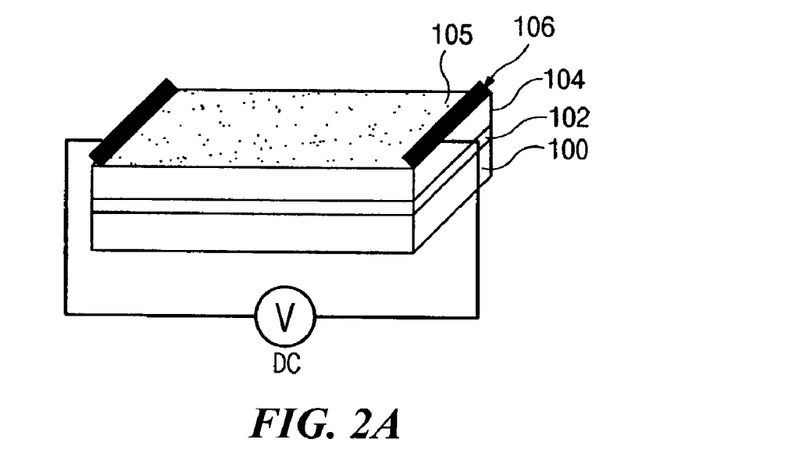
FIGS. 2A to 2E are schematic perspective views illustrating a crystallization process of an amorphous silicon layer and an activation process of an ohmic contact layer according to an exemplary embodiment of the present invention.

FIGS. 2A to 2E are schematic perspective views illustrating a crystallization process of an amorphous silicon layer and an activation process of an ohmic contact layer according to an exemplary embodiment of the present invention. In FIG. 2A, a first insulating layer 102 and an amorphous silicon layer 104 are sequentially formed on a substrate 100. The first insulating layer 102 is a buffer layer for preventing alkali materials in the substrate 100 from causing contamination in subsequent processes. In this example, a field enhanced metal induced crystallization (FE-MIC) method is used. After the amorphous silicon layer 104 is formed, a thin catalyst metal layer 105 is formed on the amorphous silicon layer 104. The catalyst metal layer 105 includes one of nickel (Ni), lead (Pb) and cobalt (Co). Electrodes 106 are respectively attached at both sides of the catalyst metal layer 105. The substrate 100, amorphous silicon layer 104 and catalyst metal layer 105 are heated to a temperature between about 500° C. and about 550° C. The amorphous silicon layer 104 is crystallized by applying a high voltage across the electrodes 106 while maintaining the temperature between about 500° C. and about 550° C.

Figure 2B:
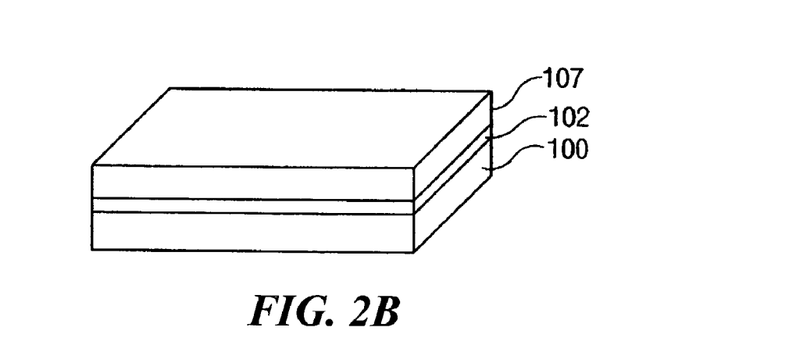

After crystallizing the amorphous silicon layer 104 (of FIG. 2A) to form a polycrystalline silicon layer 107, the catalyst metal layer 105 (of FIG. 2A) is removed, as shown in FIG. 2B.

Figure 2C:
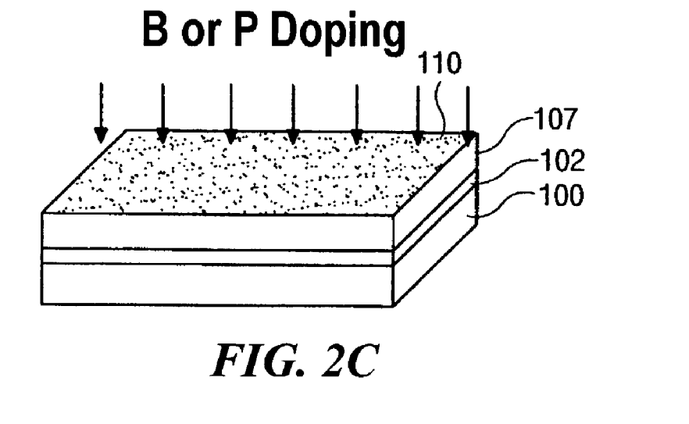

The polycrystalline silicon layer 107 is doped with dopant impurities 110, as shown in FIG. 2C. The dopant impurities 110 can include one element from either Group III or Group V. The electrical conductivity of the polycrystalline silicon layer 107 is based upon the kind of dopant impurities 110. For example, when the polycrystalline silicon layer 107 is doped with dopant impurities from Group III, such as $B_2H_6$, the polycrystalline silicon layer 107 is a p-type semiconductor. In another example, when the polycrystalline silicon layer 107 is doped with the dopant impurities from Group V, such as $PH_3$, the polycrystalline silicon layer 107 is an n-type semiconductor. After this ion doping process, the morphology of the polycrystalline silicon layer 107 is severely damaged due to the collision of the dopant impurities 110 with the crystal lattice of the polycrystalline silicon layer 107.

Figure 2D:
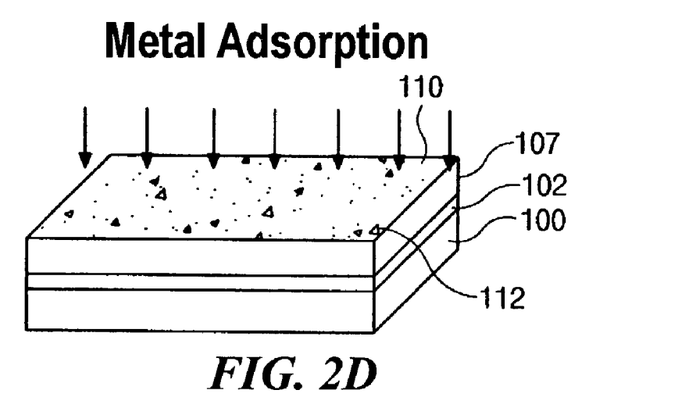

As shown in FIG. 2D, a small amount of metal 112 is applied to the polycrystalline silicon layer 107 using a sputtering method or chemical vapor deposition (CVD) method. The concentration of the small amount of metal is less than $1 \times 10^{15}$ /cm$^2$. Nickel (Ni), cobalt (Co) or lead (Pb), preferably Ni, is used as the small amount of metal 112.

Figure 2E:
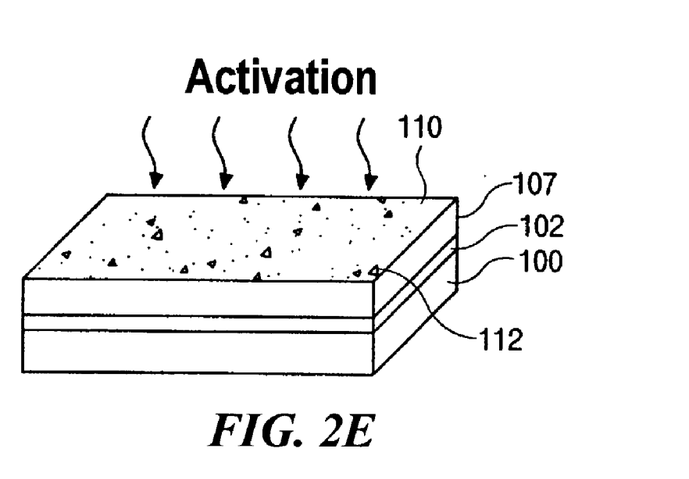

In FIG. 2E, the polycrystalline silicon layer 107 including the small amount of metal 112 is heated in a furnace of a temperature less than about 500° C., preferably, between about 350° C. and about 500° C. This is referred to as an activation process. Here, the small amount of metal 112 chemically react with the silicon to form a silicide having a high electrical conductivity. For example, when Ni is adsorbed onto the polycrystalline silicon layer 107, during the activation process, nickel silicide ($NiSi_x$) can be formed. Since the nickel silicide aids the polycrystalline silicon layer 107 in crystallization, the polycrystalline silicon layer 107 can be activated at a lower temperature. Further, the silicide reduces the contact resistance of the polycrystalline silicon layer 107.

FIGS. 3A to 3F are schematic cross-sectional views showing a fabricating process of a polycrystalline silicon thin film transistor according to an exemplary embodiment of the present invention.

Figure 3A:
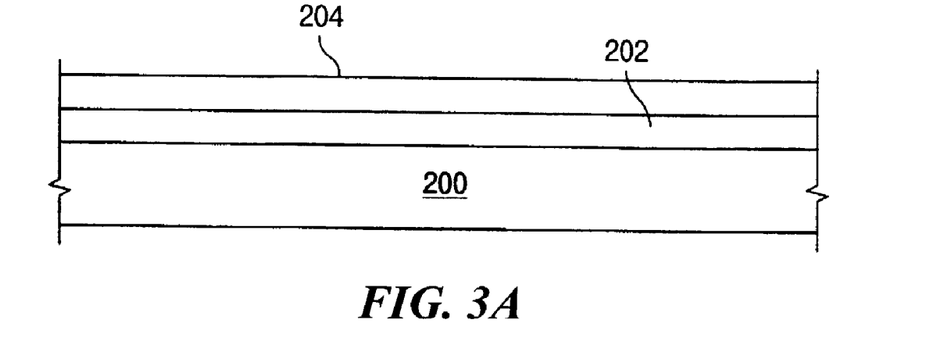
FIGS. 3A to 3F are cross-sectional views showing a fabrication process of a polycrystalline thin film transistor in accordance with an exemplary embodiment of the present invention.

As shown in FIG. 3A, a first insulating layer 202 and an amorphous silicon layer 204 are sequentially formed on a substrate 200. The first insulating layer 202 functions as a buffer layer preventing alkali materials in the substrate 200 from causing contamination in subsequent processes. After the amorphous silicon layer 204 is formed, the amorphous silicon layer 204 is crystallized to form a polycrystalline silicon layer through one of a metal induced crystallization (MIC) method, a field enhanced metal induced crystallization (FE-MIC) method, a laser annealing method and a solid phase crystallization (SPC) method.

Figure 3B:
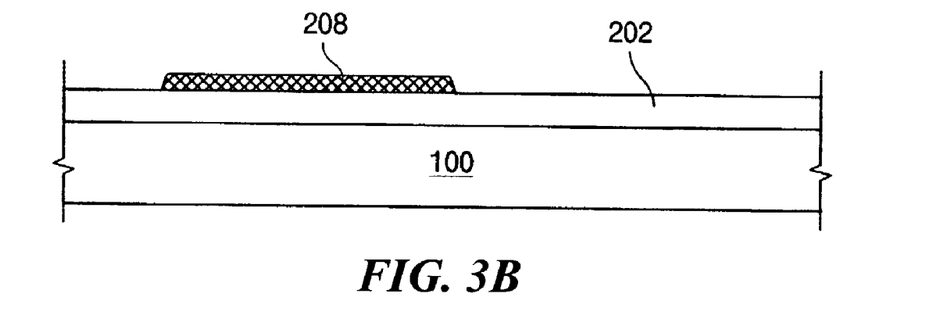

Subsequently, a silicon island 208 is then formed through patterning the polycrystalline silicon layer, as shown in FIG. 3B.

Figure 3C:
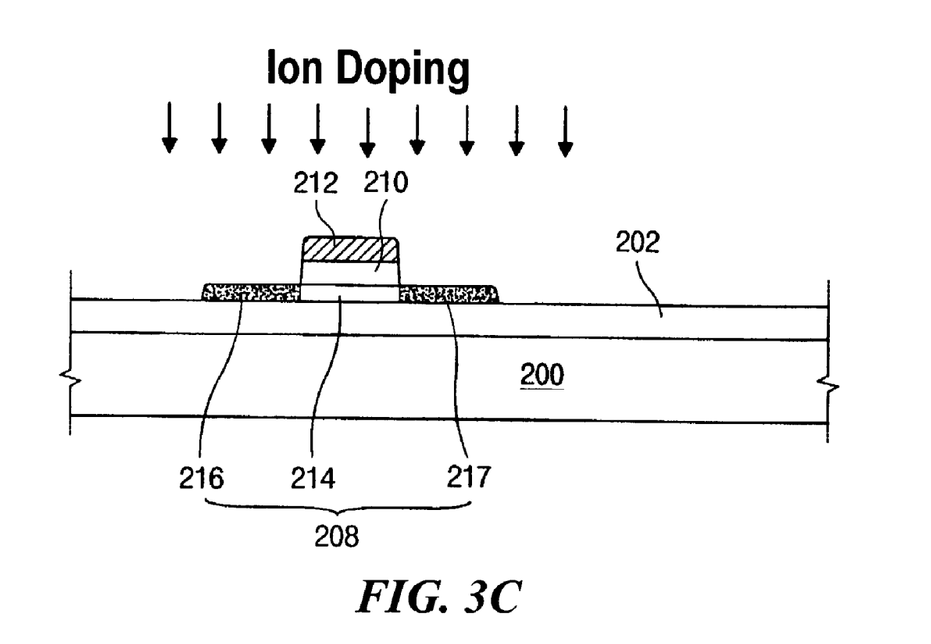

A second insulating layer 210 and a gate electrode 212 are sequentially formed on a portion of the silicon island 208. The silicon island 208 is classified into two regions: a first active region 214 and second active regions 216 and 217. The second active regions 216 and 217 are disposed at respective sides of the first active region 214 as side portions. Here, the second insulating layer 210 and the gate electrode 212 are formed on a middle portion of the silicon island 208 that is the first active region 214. The first and second insulating layers 202 and 210 can be made of one of silicon nitride (SiNx), silicon oxide ($SiO_x$) and tetra ethyl ortho silicate (TEOS), for example. The second insulating layer 210 and the gate electrode 212 are patterned using the same etching mask to reduce the number of masks.

After the second insulating layer 210 and the gate electrode 212 are formed, the second active regions 216 and 217 is doped with dopant impurities. During the doping of the second active regions 216 and 217, the gate electrode 212 functions as an ion stopper to prevent ion penetration into the first active region 214. The electrical conductivity of the second active regions depends on the type of dopant impurities used in the doping process. For example, when the second active regions 216 and 217 are doped with impurities from Group III, such as $B_2H_6$, the second active regions 216 and 217 are p-type semiconductor. In another example, when the second active regions 216 and 217 are doped with impurities from Group V, such as $PH_3$, the second active regions 216 and 217 are n-type semiconductor. The type of impurities selected depends upon the intended use of a semiconductor device.

Figure 3D:
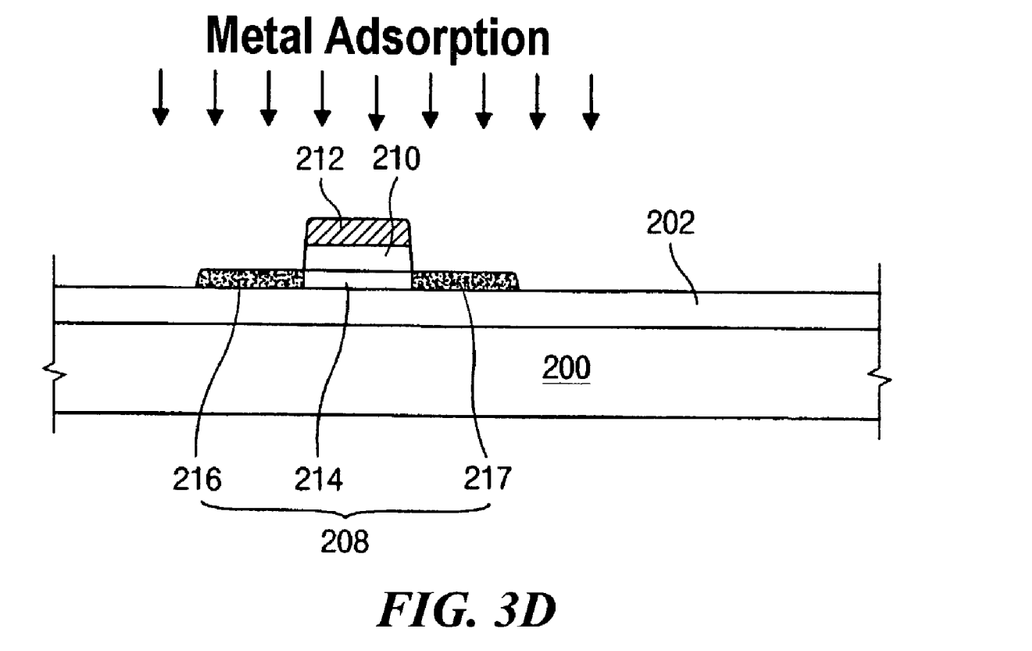

As shown in FIG. 3D, a small amount of metal is applied to the second active regions 216 and 217 through a sputtering method or a chemical vapor deposition (CVD) method. Next, the second active regions 216 and 217 are heated in a furnace to a temperature less than about 500° C., preferably, between 350° C. and 500° C. This process is referred to as an activation process.

Figure 3E:
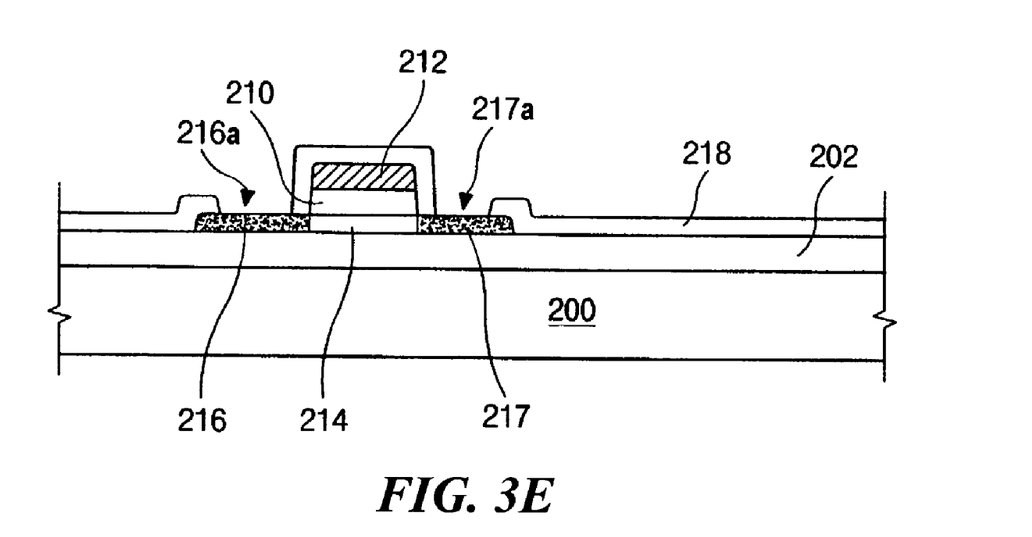

A third insulating layer 218 is formed on the entire surface of the substrate 200 as shown in FIG. 3E. The third insulating layer 218 has first and second contact holes 216a and 217a exposing the second active regions 216 and 217, respectively.

Figure 3F:
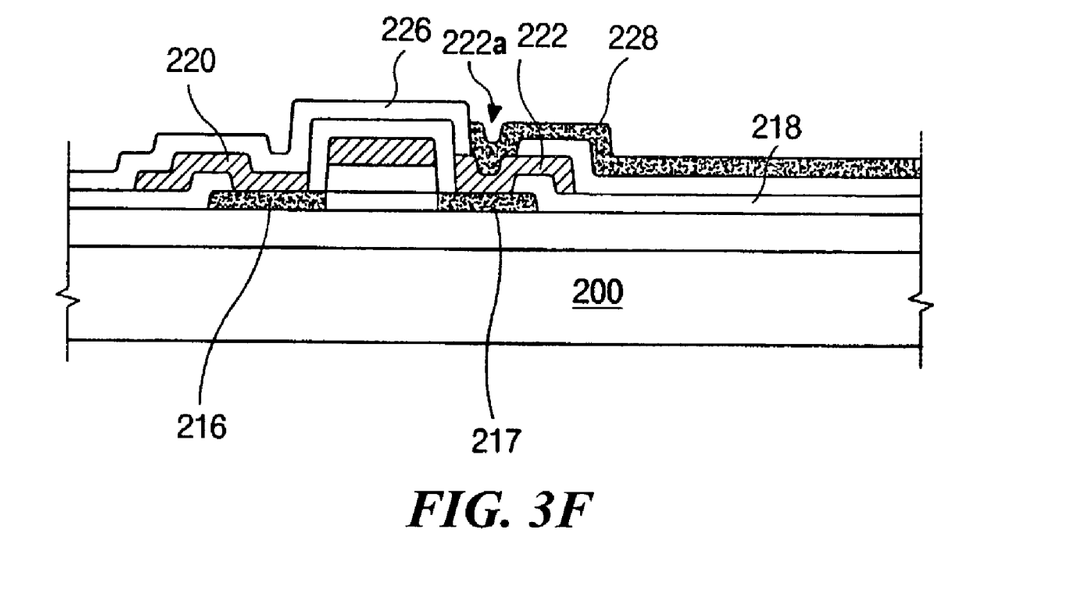

As shown in FIG. 3F, source and drain electrodes 220 and 222 are formed on the third insulating layer 218. The source and drain electrodes 220 and 222 are connected to the second active regions 216 and 217 through the first and second contact holes 216a and 217a, respectively. Next, a fourth insulating layer 226 is formed over the entire surface of the substrate 200. The fourth insulating layer 226 has a third contact hole 222a exposing the drain electrode 222. Next, a pixel electrode 228 is formed on the fourth insulating layer 226. The pixel electrode 228 is connected to the drain electrode 222 through the third contact hole 222a. Thus, a polycrystalline silicon thin film transistor (p-Si TFT) applicable to a liquid crystal display is completed.

In the present invention, the small amount of metal is deposited onto the active layer before the active layer is heated to activate dopant impurities. The small amount of metal adsorbs into the silicon layer and reacts with the silicon of the active layer to form a silicide within the active layer. Since silicide reduces contact resistance and aids in the crystallization of the polycrystalline silicon layer, the polycrystalline silicon layer can be activated at a lower temperature and the electric resistance of the polycrystalline silicon thin film transistor (p-Si TFT) can be reduced without sacrificing the crystalline structure of the polycrystalline structure.

It will be apparent to those skilled in the art that various modifications and variations can be made in the fabrication method of the present invention without departing from the spirit or scope of the invention. Thus, it is intended that the present invention cover the modifications and variations of this invention provided they come within the scope of the appended claims and their equivalents.

What is claimed is:

1. A fabricating method of a thin film transistor, comprising:
   forming an active layer of polycrystalline silicon;
   forming a first insulating layer on the active layer;
   forming a gate electrode on the first insulating layer over the active layer;
   doping side portions of the active layer with impurities;
   applying a small amount of metal to the side portions of the active layer, wherein the small amount of metal is a concentration less than about $1 \times 10^{15}/cm^2$; and
   activating the side portions of the active layer such that the small amount of metal is adsorbed into the active layer.

2. The method according to claim 1, wherein the first insulating layer is one of silicon nitride, silicon oxide and tetra ethyl ortho silicate.

3. The method according to claim 1, wherein the dopant impurities include one element of Group III.

4. The method according to claim 1, wherein the dopant impurities include one element of Group V.

5. The method according to claim 1, wherein the metal in the step of applying a small amount of metal includes one of nickel, lead and cobalt.

6. The method according to claim 1, wherein activating the side portions of the active layer is performed at a temperature of less than about 500° C.

7. The method according to claim 6, wherein activating the side portions of the active layer is performed at a temperature between about 350° C. and about 500° C.

8. The method according to claim 1, wherein the step of applying a small amount of metal to the side portions of the active layer includes one of depositing and sputtering the small amount of metal.

9. The method according to claim 1, further comprising forming a second insulating layer under the active layer.

10. The method according to claim 1, wherein the polycrystalline silicon is obtained through depositing amorphous silicon and crystallizing the amorphous silicon.

11. The method according to claim 10, wherein crystallizing the amorphous silicon is performed by one of a metal induced crystallization method, a field enhanced metal induced crystallization method, a solid phase crystallization method and a laser annealing method.

12. A fabricating method of a thin film transistor, comprising:
   forming a first insulating layer on a substrate;
   depositing an amorphous silicon layer on the first insulating layer;
   crystallizing the amorphous silicon layer to form a polycrystalline silicon layer;
   patterning the polycrystalline silicon layer to form an active layer having an island shape;
   forming a second insulating layer on a middle portion of the active layer;
   forming a gate electrode on the second insulating layer;
   doping side portions of the active layer with dopant impurities;
   applying a small amount of metal to the side portions of the active layer, wherein the small amount of metal is a concentration less than about $1 \times 10^{15}/cm^2$;
   activating the side portions of the active layer;
   forming a third insulating layer on the gate electrode and on the side portions after activating the side portions, wherein the third insulating layer has first and second contact holes respectively exposing the side portions; and
   forming source and drain electrodes connected respectively to the side portions through the first and second contact holes.

13. The method according to claim 12, wherein the first insulating layer is one of silicon nitride, silicon oxide and tetra ethyl ortho silicate.

14. The method according to claim 13, wherein the second insulating layer is one of silicon nitride, silicon oxide and tetra ethyl ortho silicate.

15. The method according to claim 12, wherein the dopant impurities include one element of Group III.

16. The method according to claim 12, wherein the dopant impurities include one element of Group V.

17. The method according to claim 12, wherein the metal in the step of applying a small amount of metal includes one of nickel, lead and cobalt.

18. The method according to claim 12, wherein activating the side portions of the active layer is performed at a temperature of less than about 500° C.

19. The method according to claim 18, wherein activating the side portions of the active layer is performed at a temperature between about 350° C. and about 500° C.

20. The method according to claim 12, wherein crystallizing the amorphous silicon is performed by one of a metal induced crystallization method, a field enhanced metal induced crystallization method, a solid phase crystallization method and a laser annealing method.

21. The method according to claim 12, wherein the step of activating the side portions of the active layer includes adsorbing the small amount of metal into the side portions.

22. The method according to claim 12, wherein the step of applying a small amount of metal to the side portions of the active layer includes one of depositing and sputtering the small amount of metal.

23. A fabricating method of a thin film transistor, comprising:
   forming an active layer of polycrystalline silicon;
   forming a first insulating layer on the active layer;
   forming a gate electrode on the first insulating layer over the active layer;
   doping side portions of the active layer with impurities;
   applying a small amount of metal to the side portions of the active layer, wherein the small amount of metal is a concentration less than about $1 \times 10^{15}/cm^2$;
   activating the side portions of the active layer such that the small amount of metal is adsorbed into the active layer;
   forming a second insulating layer on the gate electrode and on the side portions after activating the side portions, wherein the second insulating layer has first and second contact holes respectively exposing the side portions; and
   forming source and drain electrodes connected respectively to the side portions through the first and second contact holes.

* * * * *